US007242255B1

(12) United States Patent
Chen et al.

(10) Patent No.: US 7,242,255 B1
(45) Date of Patent: Jul. 10, 2007

(54) METHOD AND APPARATUS FOR MINIMIZING PHASE ERROR AND JITTER IN A PHASE-LOCKED LOOP

(75) Inventors: Yen-Chung T. Chen, Sunnyvale, CA (US); Kailashnath Nagarakanti, Santa Clara, CA (US); Sung-Hun Oh, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 138 days.

(21) Appl. No.: 11/120,914

(22) Filed: May 2, 2005

(51) Int. Cl.
*H03L 7/00* (2006.01)
*H03L 7/08* (2006.01)
*G05F 3/02* (2006.01)

(52) U.S. Cl. .................... 331/16; 331/17; 331/25; 331/1 A; 327/157; 327/536

(58) Field of Classification Search .............. 331/16, 331/17, 25, 1 A; 327/536, 148, 157
See application file for complete search history.

(56) References Cited

U.S. PATENT DOCUMENTS

| 3,898,579 | A | * | 8/1975 | Aldridge ............... 331/1 A |
| 5,508,660 | A | * | 4/1996 | Gersbach et al. ......... 331/17 |
| 6,118,346 | A | * | 9/2000 | Olgaard ................. 331/17 |
| 6,570,421 | B1 | * | 5/2003 | Gauthier et al. .......... 327/156 |
| 2003/0048126 | A1 | * | 3/2003 | Watarai ................. 327/536 |
| 2004/0257162 | A1 | * | 12/2004 | Mokeddem ............... 331/16 |

OTHER PUBLICATIONS

Publication: "Low-Jitter Process-Independent DLL and PLL Based on Self-Biased Techniques", by John G. Maneatis, IEEE Journal of Solid-Site Circuits, vol. 31, No. 11, Nov. 1996, pp. 1723 to 1732.

* cited by examiner

*Primary Examiner*—Robert Pascal
*Assistant Examiner*—Ryan J. Johnson
(74) *Attorney, Agent, or Firm*—Park, Vaughan & Fleming LLP (57) ABSTRACT

An apparatus that minimizes phase error and jitter in a phase-locked loop. The apparatus includes a phase/frequency detector, a charge pump, a loop filter, a voltage-controlled oscillator, and a frequency divider, which are coupled together to form a phase-locked loop. The charge pump within the phase-locked loop contains a pull-up network and a pull-down network which are coupled to each other, and a current compensation device. If the pull-up network and the pull-down network are both conducting, the current compensation device adjusts currents flowing through the pull-up network and through the pull-down network such that the currents are substantially equal. This ensures that very little current flows into the loop filter, thereby substantially minimizing a build-up of charge on a capacitor in the loop filter, which can cause phase error and jitter in the phase-locked loop.

12 Claims, 7 Drawing Sheets

METHOD AND APPARATUS FOR MINIMIZING PHASE ERROR AND JITTER IN A PHASE-LOCKED LOOP

BACKGROUND

1. Field of the Invention

The present invention relates to techniques for minimizing phase error and jitter in a phased-locked loop circuit. More specifically, the present invention relates to a phase-locked loop with a charge pump that has a current compensation mechanism that substantially equalizes current flowing through a pull-up network and through a pull-down network to minimize phase error and jitter in the phase-locked loop.

2. Related Art

Advances in semiconductor fabrication technology presently make it possible to integrate large-scale systems, including tens of millions of transistors, into a single semiconductor chip. Integrating such large-scale systems onto a single semiconductor chip enables increases in the frequency at which such systems can operate, because signals between system components do not have to cross chip boundaries, and are not subject to lengthy chip-to-chip propagation delays.

Figure 1:
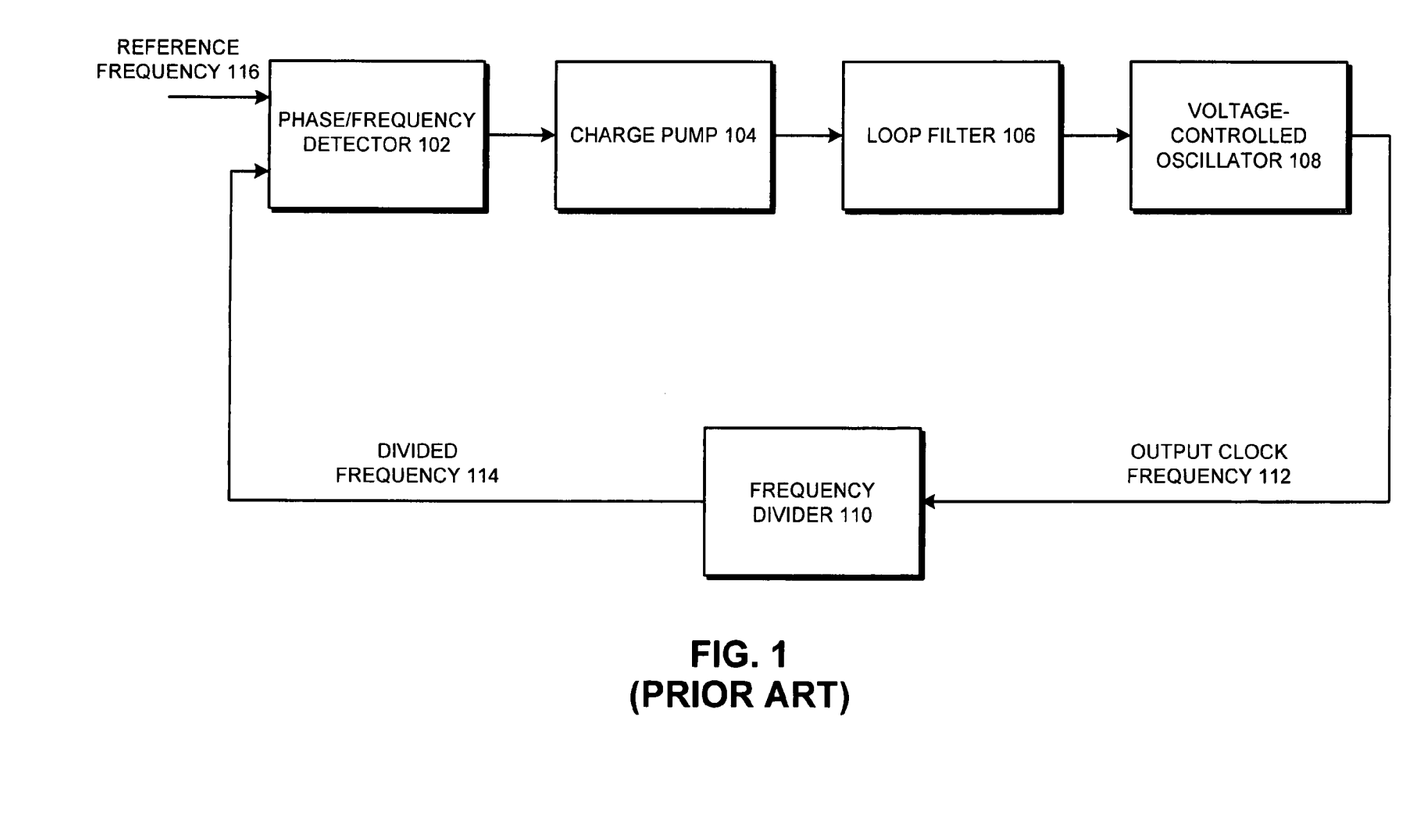
FIG. 1 presents a block diagram of a phase-locked loop.

Increasing the operating frequency of such systems typically involves using a phase-locked loop (PLL), which takes a low-frequency off-chip clock signal, typically from a quartz crystal, and generates a higher frequency clock signal. FIG. 1 presents a block diagram of such a PLL. It has phase/frequency detector 102, charge pump 104, loop filter 106, voltage-controlled oscillator 108, frequency divider 110, output clock frequency 112, divided clock 114, and reference clock 116.

The PLL operates through a feedback loop. Within this feedback loop, phase/frequency detector 102 compares the frequency and phase between reference clock 116 and divided clock 114. It then generates output signals that contain information related to the frequency and phase difference between the two input signals. The outputs of phase/frequency detector 102 pass through charge pump 104 and loop filter 106, and then into a control input of voltage-controlled oscillator 108. Voltage-controlled oscillator 108 generates output clock frequency 112 based on this control the input voltage. Frequency divider 110 then divides output clock frequency 112 and subsequently outputs divided clock 114. Through this feedback mechanism the phase and frequency between reference clock 116 and divided clock 114 becomes substantially equal after some time that is inversely proportional to the bandwidth of the feedback loop. Note that frequency divider 110 is set so that output clock frequency 112 is a multiple of reference clock frequency 116. For instance, if reference clock 116 is 100 Mhz and output clock frequency 112 is 1 GHz, frequency divider 110 divides output clock frequency 112 by a factor of 10 so that divided clock 114 is 100 Mhz.

Unfortunately, PLL design is becoming more difficult. As transistors become smaller, the supply voltages are being reduced, which reduces the headroom over the threshold voltage. Furthermore, modern high-performance systems are using high frequency clock signals in the multi-GHz range; these high frequencies reduce the tolerance for clock jitter and phase error.

Figure 2A:
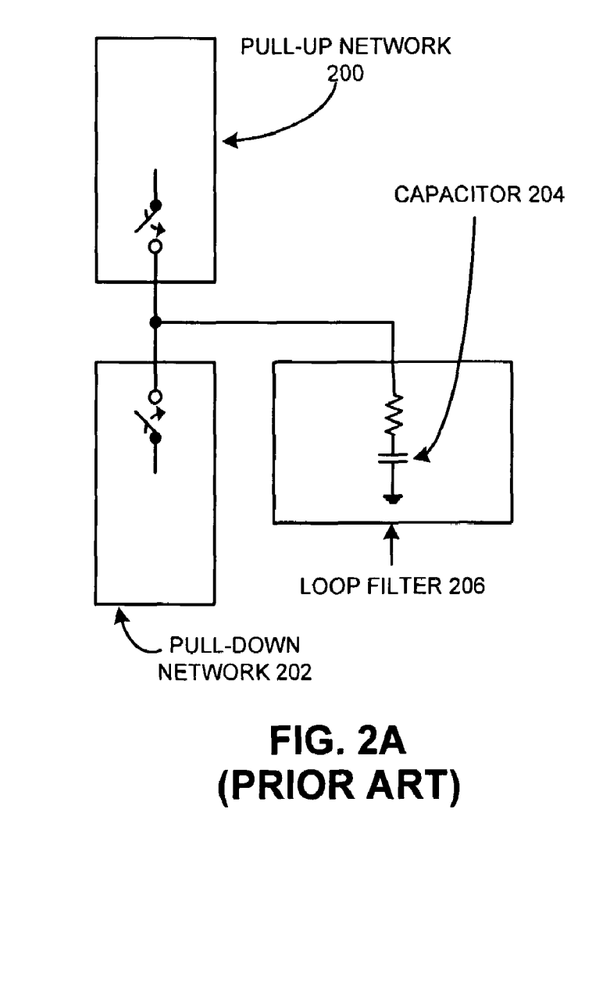
FIG. 2A presents block diagram of a typical charge pump.

FIG. 2A presents a block diagram of a typical (simplified) charge pump in a PLL. Note that there is a current mismatch between current flowing through pull-up network 200 and through pull-down network 202, which leads to charge build-up on capacitor 204 of loop filter 206 even if the phase and frequency difference is zero. This build-up, in turn, causes a shift in frequency and results in undesired phase error and jitter at the clock output.

Figure 2B:
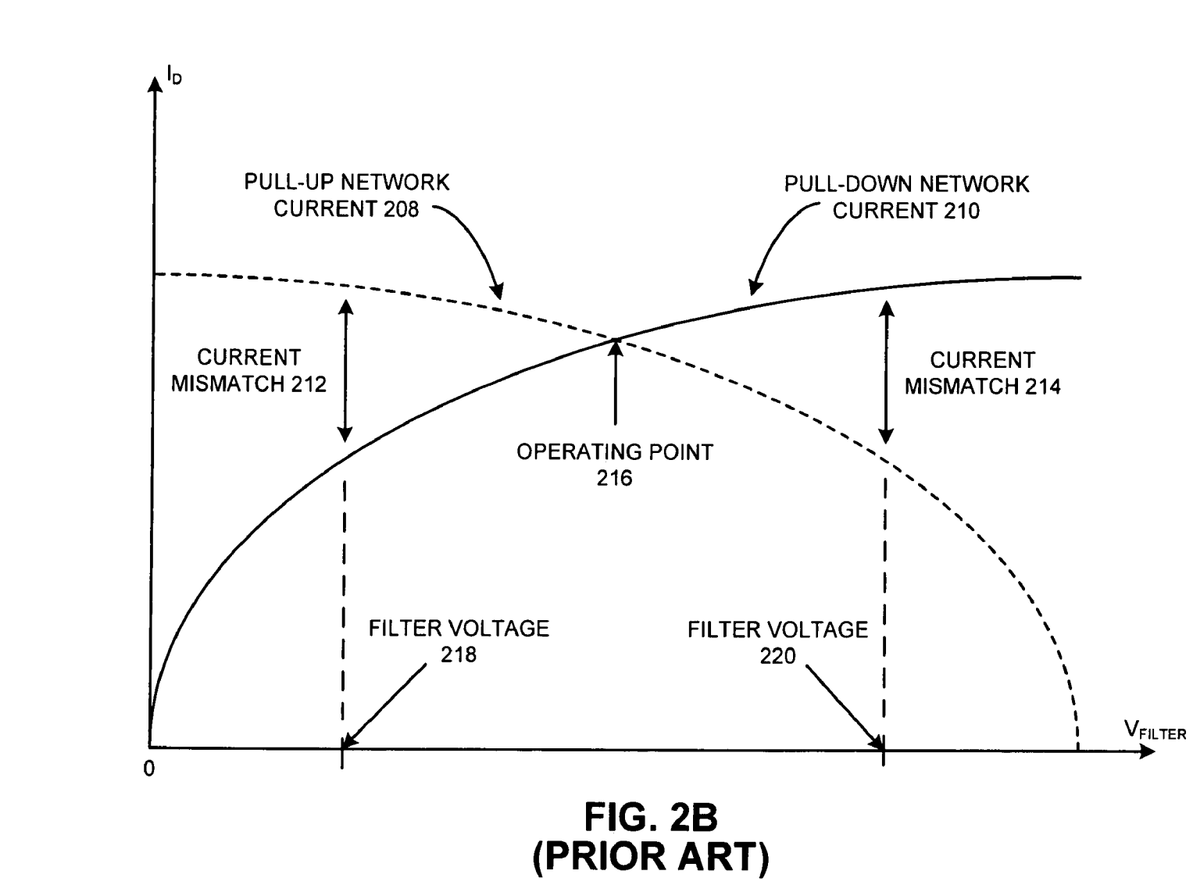
FIG. 2B presents a current-versus-voltage plot of a typical charge pump.

FIG. 2B presents a current-versus-voltage plot of typical charge pump. In FIG. 2B, load-line plots of pull-up network current 208 and pull-down network current 210 are shown. Pull-up network current 208 intersects with pull-down network current 210 at operating point 216. At all other operating voltages ($V_{FILTER}$), there is a mismatch in those currents. For instance, current mismatch 212 or current mismatch 214 can occur if the charge pump operates at filter voltage 218 or filter voltage 220, respectively.

Figure 2C:
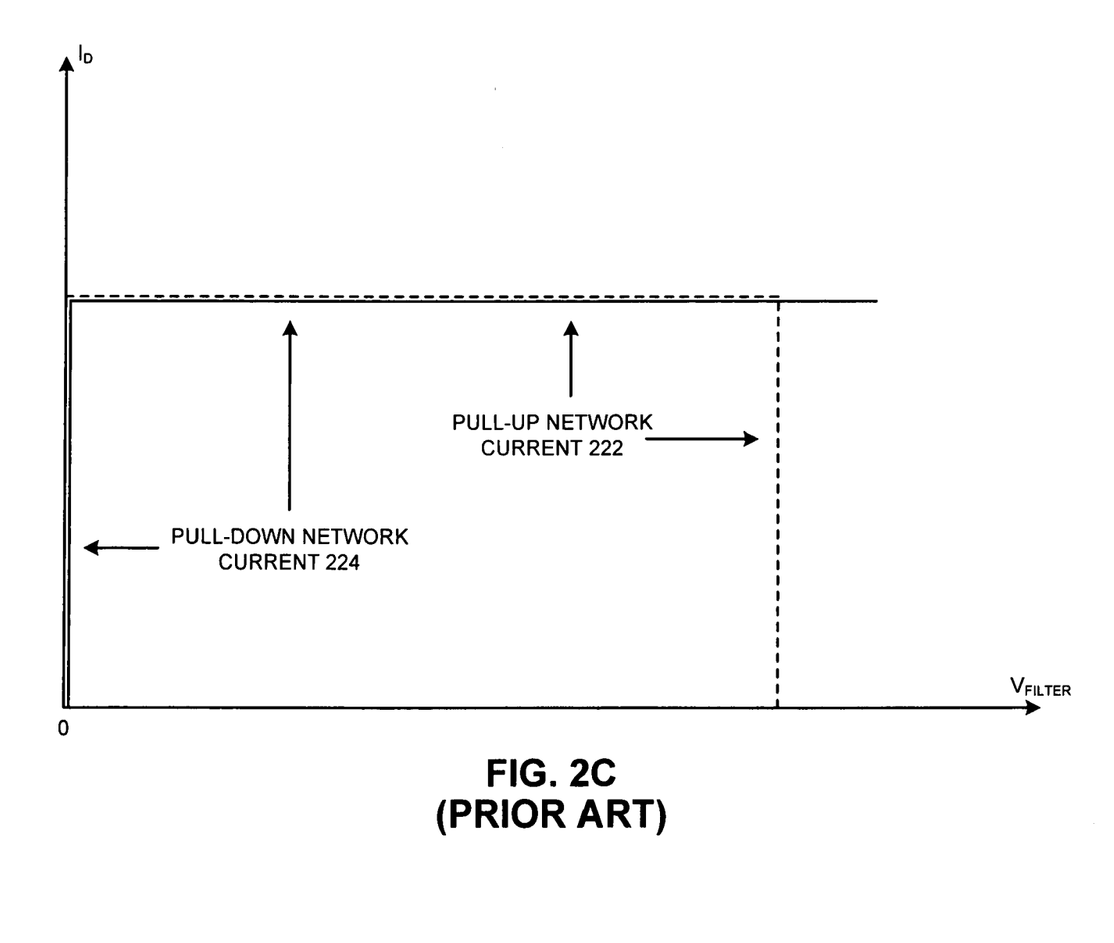
FIG. 2C presents a current-versus-voltage plot of an ideal charge pump.

FIG. 2C presents a current-versus-voltage curve of an ideal charge pump. In FIG. 2C, pull-up network current 222 and pull-down network current 224 are horizontal lines on the current-versus-voltage plot and intersect across a wide range of filter voltages. Note that the horizontal portions of the ideal curves would be directly on top of each other, but they are shown here with a small gap to illustrate the separate curves. Because an ideal charge pump is not feasible using existing technologies, the most common solution to mitigate the current mismatch problem is to cascode the current sources to boost the output impedances. Boosting the output impedances flattens the current-versus-voltage curves, thereby minimizing the current mismatch. However, boosting the output impedances reduces the output voltage swing of the charge pump. Furthermore, with sub-one-Volt power supplies, cascoding is no longer feasible because it reduces the voltage headroom for the transistors in the pull-up network and the pull-down network. This pushes the transistors out of the ideal operating range and reduces the output impedance of the pull-up network and the pull-down network.

Hence, what is needed is an apparatus for minimizing phase error and jitter in a phase-locked loop without the problems described above.

SUMMARY

One embodiment of the present invention provides an apparatus that minimizes phase error and jitter in a phase-locked loop. The apparatus includes a phase/frequency detector, a charge pump, a loop filter, a voltage-controlled oscillator, and a frequency divider, which are coupled together to form a phase-locked loop. The charge pump within the phase-locked loop contains a pull-up network and a pull-down network which are coupled to each other, and a current compensation device. If the pull-up network and the pull-down network are both conducting, the current compensation device adjusts currents flowing through the pull-up network and through the pull-down network such that the currents are substantially equal. This ensures that very little current flows into the loop filter, thereby substantially minimizing a build-up of charge on a capacitor in the loop filter, which can cause phase error and jitter in the phase-locked loop.

In a variation on this embodiment, the charge pump contains a replica of the pull-up network, a replica of the pull-down network, and a replica of the current compensation device.

In a variation on this embodiment, the replica of the pull-up network, the replica of the pull-down network, and the replica of the current compensation device are configured similarly to the pull-up network, the pull-down network, and the current compensation device, except that the replica of the pull-up network and the replica of the pull-down network both conduct current continuously.

In a variation on this embodiment, the replica of the pull-up network, the replica of the pull-down network, and the replica of the current compensation device are coupled in a negative feedback loop.

In a variation on this embodiment, the negative feedback loop is referenced to the pull-up network, the pull-down network, and the current compensation device.

In a variation on this embodiment, the negative feedback loop determines a control voltage for the replica of the current compensation device. This control voltage forces a current flowing through the replica of the pull-up network and through the replica of the pull-down network to be substantially equal.

In a variation on this embodiment, the control voltage for the replica of the current compensation device also controls the current compensation device for the pull-up network and the pull-down network.

In a variation on this embodiment, if the pull-up network and the pull-down network are both conducting, the control voltage for the replica of the current compensation device controls the current compensation device for the pull-up network and the pull-down network so that the current flowing through the pull-up network and through the pull-down network is substantially equal.

In a variation on this embodiment, the current flowing through the replica of the pull-up network, the replica of the pull-down network, and the replica of the current compensation device settles more quickly than the current through the pull-up network, the pull-down network, and the current compensation device.

In a variation on this embodiment, if the current compensation device is coupled to the pull-up network, the current compensation device adjusts current in the pull-up network to substantially match the current flowing through the pull-down network.

In a variation on this embodiment, if the current compensation device is coupled to the pull-down network, the current compensation device adjusts current in the pull-down network to substantially match the current flowing through the pull-up network.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Charge Pump System

Figure 3A:
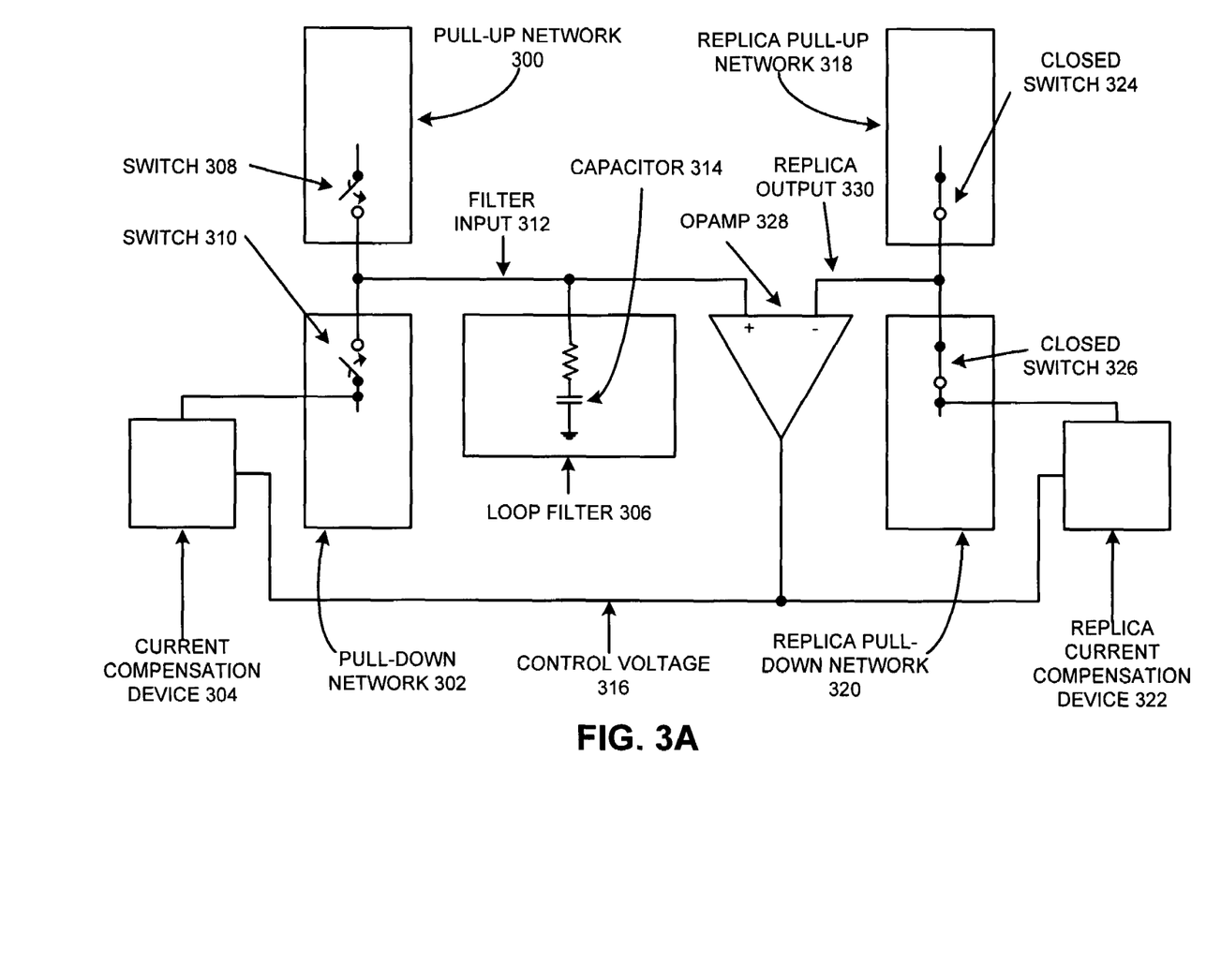
FIG. 3A presents a block diagram of a charge pump connected to a loop filter in accordance with an embodiment of the present invention.

FIG. 3A presents a block diagram of a charge pump connected to a loop filter in accordance with an embodiment of the present invention. It includes pull-up network 300, pull-down network 302, current compensation device 304, switch 308, switch 310, loop filter 306, filter input 312, capacitor 314, control voltage 316, replica pull-up network 318, replica pull-down network 320, replica current compensation device 322, closed switch 324, closed switch 326, OpAmp 328 and replica output 330.

The devices shown in this block diagram can be implemented in a technology such as CMOS, biCMOS, or any other integrated circuit technology. Pull-up network 300 and replica pull-up network 318 pull up the voltage on filter input 312 and replica output 330 respectively. Pull-down network 302 and replica pull-down network 320 pull down the voltage on filter input 312 and replica output 330 respectively. Current compensation device 304 adjusts current flowing through pull-up network 300 or through pull-down network 302 depending on whether it is connected to pull-up network 300 or pull-down network 302. Replica current compensation device 322 adjusts the current flowing through replica pull-up network 318 or through replica pull-down network 320 depending on whether it is connected to replica pull-up network 318 or replica pull-down network 320. OpAmp 328 compares the voltage on filter input 312 and replica output 330 and generates control voltage 316.

Current Compensation Device

Charge pump imbalance increases jitter and causes the phase-locked loop's output frequency to shift. Charge pump imbalance occurs when switch 308 and switch 310 in FIG. 3A are both closed and conducting current. If the current flowing through pull-up network 300 is not substantially equal to the current flowing through pull-down network 302, there will be an imbalance of current and charge will flow into filter input 312, charging up capacitor 314 in loop filter 306.

In one embodiment of the present invention, when switch 308 and switch 310 are both closed, current compensation device 304 adjusts the current flowing through pull-up network 300 or through pull-down network 302 so that the current flowing through pull-up network 300 is substantially equal to the current flowing through pull-down network 302. Adjusting the current flowing through pull-up network 300 or through pull-down network 302 is beneficial because it substantially minimizes charge build-up on capacitor 314 in loop filter 306, thereby substantially reducing jitter and phase error.

If current compensation device 304 is coupled to pull-down network 302, current compensation device 304 adjusts current flowing through pull-down network 302 so that it substantially equals the current flowing through pull-up network 300. FIG. 3A shows current compensation device 304 and replica current compensation device 322 connected to pull-down network 302 and replica pull-down network 320 respectively. Note that current compensation device 304 and replica current compensation device 322 are connected below switch 310 and closed switch 326, respectively, in order to assist pull-down network 302 and replica pull-down network 320 in sinking current.

Figure 3B:
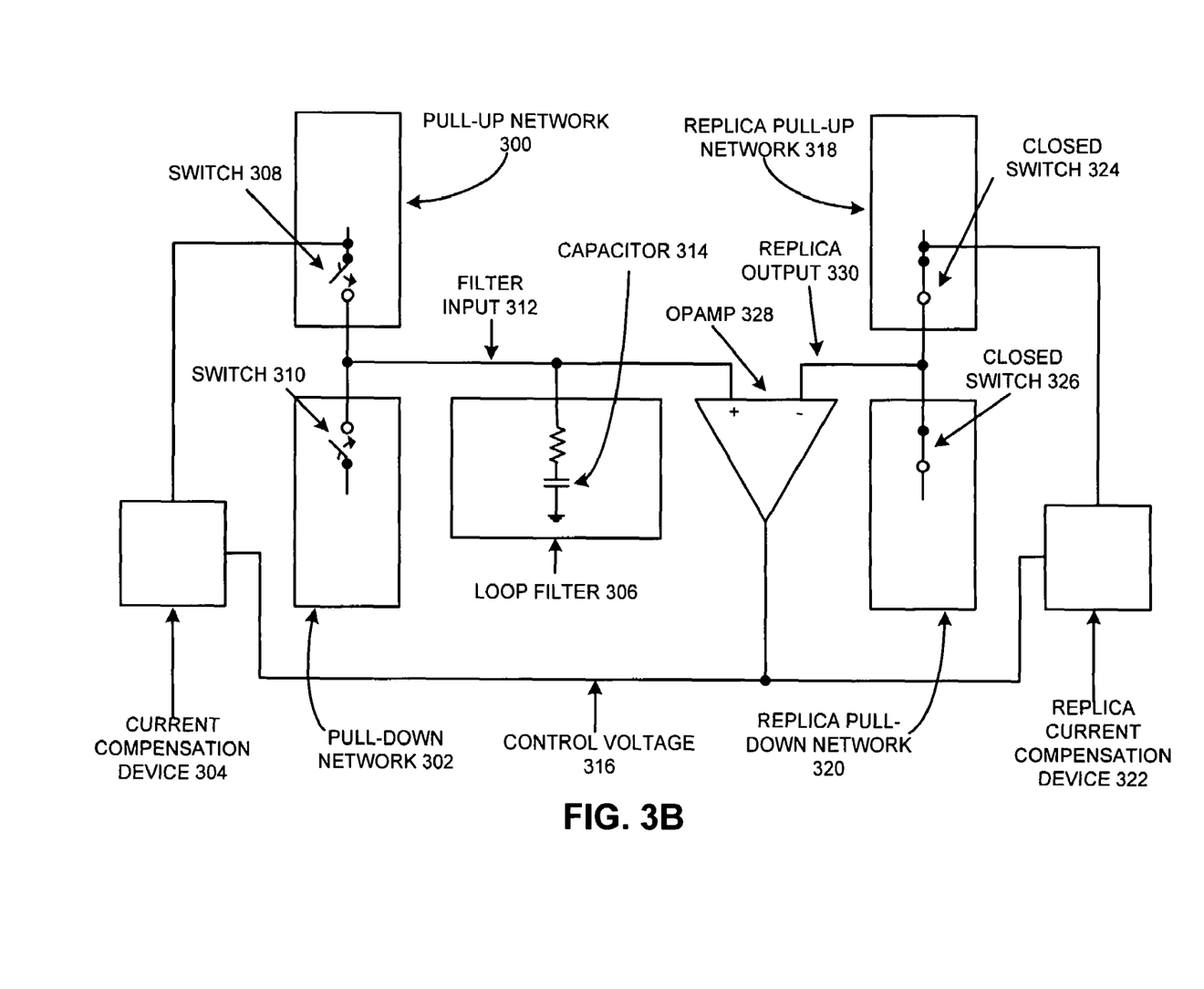
FIG. 3B presents a block diagram of a charge pump connected to a loop filter in accordance with an embodiment of the present invention.

If current compensation device 304 is coupled to pull-up network 300, current compensation device 304 adjusts the current flowing through pull-up network 300 so that it substantially equals the current flowing through pull-down network 302. FIG. 3B presents a block diagram of a charge pump connected to a loop filter in accordance with an embodiment of the present invention. FIG. 3B is similar to FIG. 3A except that current compensation device 304 and replica current compensation device 322 are connected to pull-up network 300 and replica pull-up network 318 respectively. Note that in FIG. 3B, current compensation device 304 and replica current compensation device 322 are connected above switch 308 and closed switch 324, respectively, in order to assist pull-up network 300 and replica pull-up network 318 in sourcing current.

Note that pull-up network 300 and replica pull-up network 318 are current sources. Pull-down network 302 and replica pull-down network 320 are current sinks. Variations in the current sources and current sinks must be taken into account. For example, due to finite impedance of the MOSFET, in order to match a 100 uA current source, the current sink should sink at most 80 uA, leaving the rest of the sinking to the compensation device.

Replica Network

Capacitor 314 in FIG. 3A and FIG. 3B is large and therefore reacts slowly to changes in current. In one embodiment of the present invention, replicas of pull-up network 300, pull-down network 302, and current compensation device 304 are created to speed up the determination of control voltage 316. Replica pull-up network 318, replica pull-down network 320, and replica current compensation device 322 are configured similarly to pull-up network 300, pull-down network 302, and current compensation device 304 except that closed switch 324 and closed switch 326 are permanently closed. Replica output 330 has much less capacitance than filter input 312 and can quickly adjust to changes in current.

Negative Feedback Loop

In one embodiment of the present invention, replica pull-up network 318, replica pull-down network 320, and replica current compensation device 322 are coupled together into a negative feedback loop using OpAmp 328. This negative feedback loop is referenced to filter input 312. The negative feedback loop sets control voltage 316 such that replica current compensation device 322 adjusts the current flowing through replica pull-up network 318 and through replica pull-down network 320 so that the current flowing through replica pull-up network 318 and replica pull-down network 320 are substantially equal. Note that though FIG. 3A and FIG. 3B show control voltage 316 connected directly from the output of OpAmp 328 to replica current compensation device 322, the output of OpAmp 328 can be coupled to other devices, such as level shifters (not shown), prior to being coupled to replica current compensation device 322.

In one embodiment of the present invention, control voltage 316 is also used to control current compensation device 304 such that when pull-up network 300 and pull-down network 302 are both conducting, current compensation device 304 adjusts the current flowing through pull-up network 300 and through pull-down network 302 so that the current flowing through pull-up network 300 and through pull-down network 302 are substantially equal. Again, note that though FIG. 3A and FIG. 3B show control voltage 316 connected directly from the output of OpAmp 328 to current compensation device 304, the output of OpAmp 328 can be coupled to other devices, such as level shifters (not shown), prior to being coupled to current compensation device 304.

Figure 4:
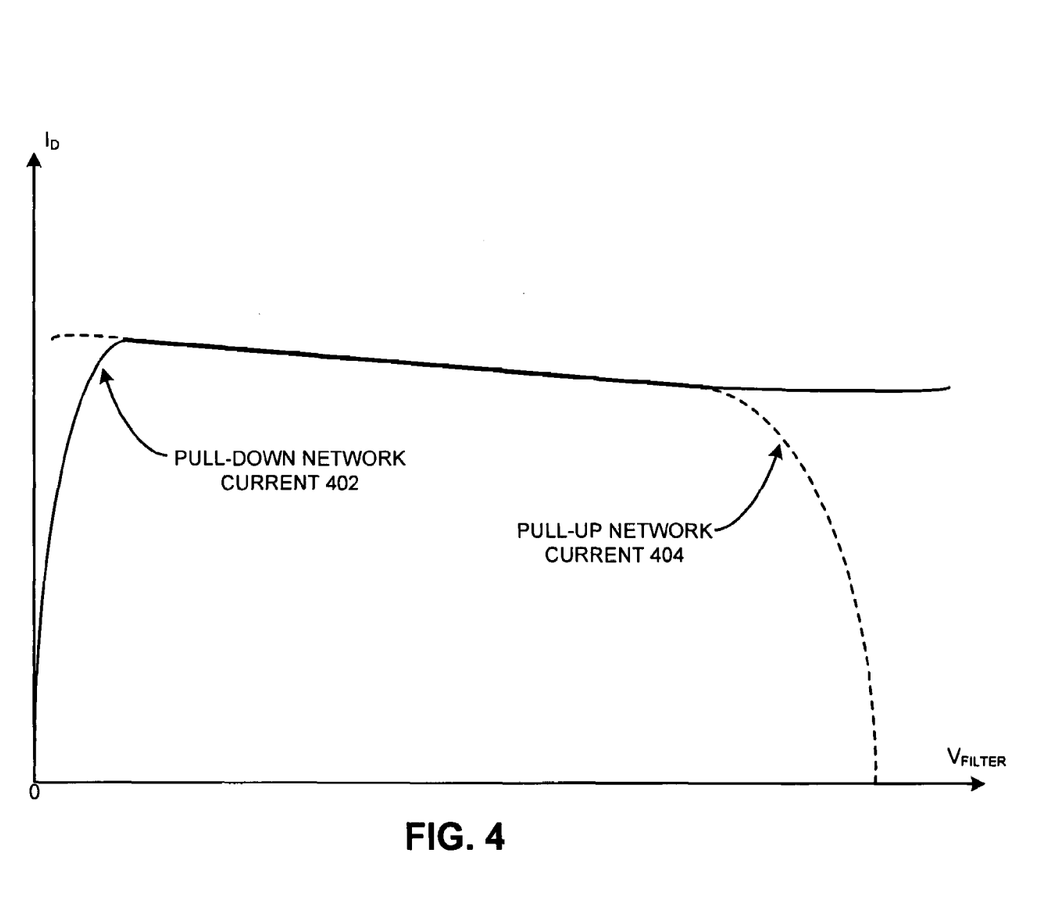
FIG. 4 presents a current-versus-voltage plot of a charge pump in accordance with an embodiment of the present invention.

FIG. 4 presents a current-versus-voltage plot of a charge pump in accordance with an embodiment of the present invention. A load-line plot of pull-down network current 402 and pull-up network current 404 is shown. In contrast to FIG. 2B, pull-down network current 402 and pull-up network current 404 are substantially equal over a wide range of the filter input voltage ($V_{FILTER}$), thereby substantially minimizing jitter and phase error. Note that unlike the ideal charge pump load lines presented in FIG. 2C, pull-down network current 402 and pull-up network current 404 are not horizontal lines. Instead, pull-down network current 402 and pull-up network current 404 track each other so that the currents are substantially equal regardless of the shape of the curves.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. An apparatus that minimizes phase error and jitter in a phase-locked loop, comprising:
    a phase/frequency detector;
    a charge pump;
    a loop filter;
    a voltage-controlled oscillator; and
    a frequency divider;
    wherein the phase/frequency detector, the charge pump, the loop filter, the voltage-controlled oscillator, and frequency divider are coupled together to form a phase-locked loop;
    wherein the charge pump contains a pull-up network and a pull-down network which are coupled to each other, a current compensation device, a replica of the pull-up network and a replica of the pull-down network which are coupled to each other, and a replica of the current compensation device;
    wherein the replica of the pull-up network and the replica of the pull-down network both conduct current continuously; and
    wherein if the pull-up network and the pull-down network are both conducting, the current compensation device adjusts currents flowing through one of the pull-up network and through the pull-down network such that the current flowing through the pull-up network and through the pull-down network are substantially equal, so that substantially no current flows into a capacitor of the loop filter, thereby substantially minimizing a build-up of charge on the capacitor which can cause phase error and jitter in the phase-locked loop.

2. The apparatus of claim 1,
    wherein the replica of the pull-up network, the replica of the pull-down network, and the replica of the current compensation device are coupled in a negative feedback loop;
    wherein the negative feedback loop is referenced to the pull-up network, the pull-down network, and the current compensation device;

wherein the negative feedback loop determines a control voltage for the replica of the current compensation device;

wherein the control voltage for the replica of the current compensation device forces a current flowing through the replica of the pull-up network and through the replica of the pull-down network to be substantially equal;

wherein the control voltage for the replica of the current compensation device also controls the current compensation device for the pull-up network and the pull-down network;

wherein if the pull-up network and the pull-down network are both conducting, and the current compensation device is connected to the pull-down network, the control voltage for the replica of the current compensation device controls the current compensation device for the pull-down network so that the current flowing through the pull-up network and through the pull-down network are substantially equal; and wherein if the pull-up network and the pull-down network are both conducting, and the current compensation device is connected to the pull-up network, the control voltage for the replica of the current compensation device controls the current compensation device for the pull-up network so that the current flowing through the pull-up network and through the pull-down network are substantially equal.

3. The apparatus of claim 1, wherein the current flowing through the replica of the pull-up network, the replica of the pull-down network, and the replica of the current compensation device settles more quickly than the current through the pull-up network, the pull-down network, and the current compensation device.

4. The apparatus of claim 1, wherein if the current compensation device is coupled to the pull-up network, the current compensation device adjusts current in the pull-up network to substantially match the current flowing through the pull-down network; and wherein if the current compensation device is coupled to the pull-down network, the current compensation device adjusts current in the pull-down network to substantially match the current flowing through the pull-up network.

5. A computer system including a phase-locked loop that minimizes phase error and jitter, comprising:

a processor;

a memory; and a phase-locked loop;

wherein the phase-locked loop is comprised of,
a phase/frequency detector,
a charge pump,
a loop filter,
a voltage-controlled oscillator, and
a frequency divider;

wherein the charge pump contains a pull-up network and a pull-down network which are coupled to each other, a current compensation device; a replica of the pull-up network and a replica of the pull-down network which are coupled to each other, and a replica of the current compensation device;

wherein the replica of the pull-up network and the replica of the pull-down network both conduct current continuously; and wherein if the pull-up network and the pull-down network are both conducting, the current compensation device adjusts currents flowing through one of the pull-up network and through the pull-down network such that the current flowing through the pull-up network and through the pull-down network are substantially equal, so that substantially no current flows into a capacitor of the loop filter, thereby substantially minimizing a build-up of charge on the capacitor which can cause phase error and jitter in the phase-locked loop.

6. The computer system of claim 5, wherein the replica of the pull-up network, the replica of the pull-down network, and the replica of the current compensation device are coupled in a negative feedback loop;

wherein the negative feedback loop is referenced to the pull-up network, the pull-down network, and the current compensation device;

wherein the negative feedback loop determines a control voltage for the replica of the current compensation device;

wherein the control voltage for the replica of the current compensation device forces a current flowing through the replica of the pull-up network and through the replica of the pull-down network to be substantially equal;

wherein the control voltage for the replica of the current compensation device also controls the current compensation device for the pull-up network and the pull-down network; and wherein if the pull-up network and the pull-down network are both conducting, and the current compensation device is connected to the pull-down network, the control voltage for the replica of the current compensation device controls the current compensation device for the pull-down network so that the current flowing through the pull-up network and through the pull-down network are substantially equal; and wherein if the pull-up network and the pull-down network are both conducting, and the current compensation device is connected to the pull-up network, the control voltage for the replica of the current compensation device controls the current compensation device for the pull-up network so that the current flowing through the pull-up network and through the pull-down network are substantially equal.

7. The computer system of claim 5, wherein the current flowing through the replica of the pull-up network, the replica of the pull-down network, and the replica of the current compensation device settles more quickly than the current through the pull-up network, the pull-down network, and the current compensation device.

8. The computer system of claim 5, wherein if the current compensation device is coupled to the pull-up network, the current compensation device adjusts current in the pull-up network to substantially match the current flowing through the pull-down network; and wherein if the current compensation device is coupled to the pull-down network, the current compensation device adjusts current in the pull-down network to substantially match the current flowing through the pull-up network.

9. A method for minimizing phase error and jitter in a phase-locked loop which includes, a phase/frequency detector, a charge pump, a loop filter, a voltage-controlled oscillator, and a frequency divider, wherein the charge pump contains a pull-up network and a pull-down network which are coupled to each other, a current compensation device, a replica of the pull-up network and a replica of the pull-down network which are coupled to each other, and a replica of the current compensation device, wherein the replica of the pull-up network and the replica of the pull-down network both conduct current continuously, and the method comprising:

determining at the current compensation device if the pull-up network and the pull-down network are both conducting;

if so, adjusting currents flowing through one of the pull-up network and through the pull-down network such that the current flowing through the pull-up network and through the pull-down network are substantially equal, so that substantially no current flows into a capacitor of the loop filter, thereby substantially minimizing a build-up of charge on the capacitor which can cause phase error and jitter in the phase-locked loop.

10. The method of claim 9, wherein adjusting the currents involves:

coupling the replica of the pull-up network, the replica of the pull-down network, and the replica of the current compensation device in a negative feedback loop;

referencing the negative feedback loop to the pull-up network, the pull-down network, and the current compensation device;

using the negative feedback loop to determine a control voltage for the replica of the current compensation device; and     using the control voltage for the replica of the current compensation device to force a current flowing through the replica of the pull-up network and through the replica of the pull-down network to be substantially equal; and     using the control voltage for the replica of the current compensation device to control the current compensation device for the pull-up network and the pull-down network;

wherein if the pull-up network and the pull-down network are both conducting, and the current compensation device is connected to the pull-down network, the control voltage for the replica of the current compensation device controls the current compensation device for the pull-down network so that the current flowing through the pull-up network and through the pull-down network are substantially equal; and     wherein if the pull-up network and the pull-down network are both conducting, and the current compensation device is connected to the pull-up network, the control voltage for the replica of the current compensation device controls the current compensation device for the pull-up network so that the current flowing through the pull-up network and through the pull-down network are substantially equal.

11. The method of claim 9, wherein the current flowing through the replica of the pull-up network, the replica of the pull-down network, and the replica of the current compensation device settles more quickly than the current through the pull-up network, the pull-down network, and the current compensation device.

12. The method of claim 9, wherein if the current compensation device is coupled to the pull-up network, the adjusting the currents involves adjusting current in the pull-up network to substantially match the current flowing through the pull-down network; and wherein if the current compensation device is coupled to the pull-down network, the adjusting the currents involves adjusting current in the pull-down network to substantially match the current flowing through the pull-up network.

\* \* \* \* \*